(12) United States Patent
Kim et al.

(10) Patent No.: US 7,564,094 B2
(45) Date of Patent: Jul. 21, 2009

(54) NON-VOLATILE MEMORY DEVICES AND METHODS OF MANUFACTURING THE SAME

(75) Inventors: Dong-Hyun Kim, Gyeonggi-do (KR); Chang-Jin Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/004,985

(22) Filed: Dec. 21, 2007

(65) Prior Publication Data

US 2008/0150008 A1 Jun. 26, 2008

(30) Foreign Application Priority Data

Dec. 21, 2006 (KR) .................. 10-2006-0131603

(51) Int. Cl.
*H01L 21/8238* (2006.01)
(52) U.S. Cl. .................. 257/324; 438/201; 438/261; 438/591; 438/593; 438/594; 257/E21.423; 257/E29.309
(58) Field of Classification Search .......... 257/314, 257/324, 637, 640, E21.423, E29.309; 438/201, 438/216, 257, 593, 261, 591, 592, 594–595
See application file for complete search history.

(56) References Cited

U.S. PATENT DOCUMENTS 5,496,753 A * 3/1996 Sakurai et al. .......... 438/591

2003/0111672 A1 * 6/2003 Cavins et al. .......... 257/202
2004/0009642 A1 * 1/2004 Yoo et al. .......... 438/257
2005/0037575 A1 * 2/2005 Lee .......... 438/257

FOREIGN PATENT DOCUMENTS

| KR | 1020050112603 | 12/2005 |
| KR | 1020060000793 | 1/2006 |
| KR | 1020060079372 | 7/2006 |

* cited by examiner

*Primary Examiner*—A. Sefer
*Assistant Examiner*—Ermias Woldegeorgis
(74) *Attorney, Agent, or Firm*—Myers Bigel Sibley & Sajovec

(57) ABSTRACT

Non-volatile memory devices include a tunnel insulating layer on a channel region of a substrate, a charge-trapping layer pattern on the tunnel insulating layer and a first blocking layer pattern on the charge-trapping layer pattern. Second blocking layer patterns are on the tunnel insulating layer proximate sidewalls of the charge-trapping layer pattern. The second blocking layer patterns are configured to limit lateral diffusion of electrons trapped in the charge-trapping layer pattern. A gate electrode is on the first blocking layer pattern. The second blocking layer patterns may prevent lateral diffusion of the electrons trapped in the charge-trapping layer pattern.

8 Claims, 3 Drawing Sheets

NON-VOLATILE MEMORY DEVICES AND METHODS OF MANUFACTURING THE SAME

CROSS-REFERENCE TO RELATED APPLICATION

This application is related to and claims priority under 35 USC § 119 to Korean Patent Application No. 2006-131603, filed on Dec. 21, 2006 in the Korean Intellectual Property Office (KIPO), the contents of which are incorporated herein by reference in their entirety.

BACKGROUND OF THE INVENTION

The present invention relates to non-volatile memory devices and methods of manufacturing the same. More particularly, the present invention relates to non-volatile memory devices including a charge-trapping layer and methods of manufacturing the same.

Integrated circuit (e.g., semiconductor) memory devices are generally classified as either volatile or non-volatile memory devices. Volatile memory devices, such as dynamic random access memory (DRAM) devices and static random access memory (SRAM) devices, have relatively high input/output (I/O) speeds. However, volatile semiconductor memory devices lose data stored therein when power is shut off. On the other hand, although non-volatile memory devices, such as electrically erasable programmable read-only memory (EEPROM) devices and/or flash memory devices, typically have relatively slow I/O speeds, non-volatile memory devices are able to maintain data stored therein even when power is shut off.

In EEPROM devices, data is electrically stored, i.e., programmed or erased through a Fowler-Nordheim (F-N) tunneling mechanism and/or a channel hot electron injection mechanism. Flash memory devices are generally classified as either a floating gate type or a charge trap type, such as silicon-oxide-nitride-oxide semiconductor (SONOS) type devices or metal-oxide-nitride-oxide semiconductor (MONOS) type devices.

The charge trap type non-volatile memory device typically includes a tunnel insulating layer formed on a channel region of a semiconductor substrate, a charge-trapping layer for trapping electrons from the channel region, a dielectric layer formed on the charge-trapping layer, a gate electrode formed on the dielectric layer, spacers formed on sidewalls of the gate electrode and source/drain regions formed at surface portions of the semiconductor substrate adjacent to the channel region.

When thermal stress is applied to the charge trap type non-volatile memory device, electrons trapped in the charge-trapping layer may be laterally diffused, which may deteriorate high-temperature stress (HTS) characteristics of the non-volatile memory device. For example, when a non-volatile memory device is maintained at a temperature of about 200° C. for about 2 hours, the threshold voltage of the non-volatile memory device may be significantly reduced. For example, when programming and erasing operations of a non-volatile memory device are repeatedly performed about 1,000 to about 1,200 times, and the non-volatile memory device is then maintained at a temperature of about 200° C. for about 2 hours, the threshold voltage of the non-volatile memory device may be significantly reduced.

To limit the lateral diffusion of electrons, portions of the charge-trapping layer between memory cells may be removed. However, it is difficult to control an etching process for partially removing the portions of the charge-trapping layer because an etching selectivity between a silicon nitride layer serving as the charge-trapping layer and a silicon oxide layer serving as the tunnel insulating layer is typically small and the charge-trapping layer is generally very thin. Further, the tunnel insulating layer may be damaged while etching the charge-trapping layer.

SUMMARY OF THE INVENTION

In some embodiments of the present invention, a non-volatile memory device includes a tunnel insulating layer on a channel region of a substrate, a charge-trapping layer pattern on the tunnel insulating layer and a first blocking layer pattern on the charge-trapping layer pattern. Second blocking layer patterns are on the tunnel insulating layer proximate sidewalls of the charge-trapping layer pattern. The second blocking layer patterns are configured to limit lateral diffusion of electrons trapped in the charge-trapping layer pattern. A gate electrode is on the first blocking layer pattern. The second blocking layer patterns may prevent lateral diffusion of the electrons trapped in the charge-trapping layer pattern.

In further embodiments, the non-volatile memory device further includes a hard mask on the gate electrode. A nitride layer pattern may be included between the gate electrode and the hard mask that limits oxidation of the gate electrode. Spacers may be included on side walls (surfaces) of the gate electrode and the first blocking layer pattern may be disposed beneath the gate electrode and the spacers. The spacers may be silicon oxide. The spacers may include nitride spacers on side walls (surfaces) of the gate electrode and oxynitride spacers on the nitride spacers.

In other embodiments, the gate electrode is polysilicon doped with impurities, metal, metal nitride, metal oxide, metal oxynitride and/or metal silicide. The gate electrode may be titanium (Ti), titanium nitride (TiN), tantalum (Ta), tantalum nitride (TaN), tungsten (W), tungsten nitride (WN), hafnium (Hf), niobium (Nb), molybdenum (Mo), molybdenum nitride ($Mo_2N$), ruthenium monoxide (RuO), ruthenium dioxide ($RuO_2$), iridium (Ir), iridium oxide ($IrO_2$), platinum (Pt), cobalt (Co), chromium (Cr), titanium aluminide ($Ti_3Al$), titanium aluminum nitride ($Ti_2AlN$), palladium (Pd), tungsten silicide (WSi), nickel silicide (NiSi), cobalt silicide (CoSi) and/or tantalum silicide (TaSi).

In further embodiments, the first blocking layer pattern has a dielectric constant higher than that of silicon nitride, such as metal oxide, metal oxynitride, metal silicon oxide and/or metal silicon oxynitride. The first blocking layer pattern may be hafnium (Hf), zirconium (Zr), aluminum (Al), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and/or lutetium (Lu).

In yet other embodiments, the charge-trapping layer pattern is a charge-trapping material and the second blocking layer patterns are an oxide of the charge-trapping material. For example, the charge-trapping layer pattern may be silicon nitride and the second blocking layer patterns may be silicon oxynitride. The tunnel insulating layer may include a silicon oxide first tunnel insulating layer and the non-volatile memory device may further include a second tunnel insulating layer on the first tunnel insulating layer, the second tunnel insulating layer having a thickness less than that of the first tunnel insulating layer and being metal oxide and/or metal nitride. Source/drain regions may be provided at surface portions of the substrate adjacent to the channel region.

In further embodiments, methods of manufacturing a nonvolatile memory device include forming a tunnel insulating layer on a channel region of a substrate, forming a charge-trapping layer on the tunnel insulating layer and forming a blocking layer on the charge-trapping layer. A gate electrode is formed on the blocking layer. The blocking layer is patterned to form a first blocking layer pattern between the charge-trapping layer and the gate electrode and to expose portions of the charge-trapping layer to form a charge-trapping layer pattern under the first blocking patter. Second blocking layer patterns are formed proximate sidewalls of the charge-trapping layer pattern to limit lateral diffusion of electrons trapped in the charge-trapping layer pattern. The second blocking layer patterns may prevent lateral diffusion of the electrons trapped in the charge-trapping layer pattern.

In other embodiments, forming the gate electrode includes forming a gate conductive layer on the blocking layer, forming a hard mask on the gate conductive layer and etching the gate conductive layer using the hard mask as an etching mask to form the gate electrode. A nitride layer may be formed on the gate conductive layer to limit oxidation of the gate electrode. Spacers may be formed on side surfaces of the gate electrode and the charge-trapping layer may be patterned using the spacers as etching masks.

In yet further embodiments, forming the second blocking layer patterns includes oxidizing the exposed portions of the charge-trapping layer and the charge-trapping layer pattern extends under the first blocking pattern between the second blocking layer patterns. Oxidizing the exposed portions of the charge-trapping layer may include oxidizing the exposed portions of the charge-trapping layer using oxygen radicals. Oxidizing the exposed portions of the charge-trapping layer may include oxidizing the exposed portions of the charge-trapping layer using a reactive gas of oxygen ($O_2$) and hydrogen ($H_2$). Oxidizing the exposed portions of the charge-trapping layer may include oxidizing the exposed portions of the charge-trapping layer at a temperature of about 800° C. to about 1,100° C. Oxidizing the exposed portions of the charge-trapping layer may include oxidizing the exposed portions of the charge-trapping layer under a gas atmosphere comprising oxygen ($O_2$), ozone ($O_3$), water vapor ($H_2O$), nitrogen monoxide (NO) and/or nitrous oxide ($N_2O$).

BRIEF DESCRIPTION OF THE DRAWINGS

Example embodiments of the present invention will become readily apparent along with the following detailed description when considered in conjunction with the accompanying drawings wherein.

DESCRIPTION OF THE EMBODIMENTS

Figure 1:
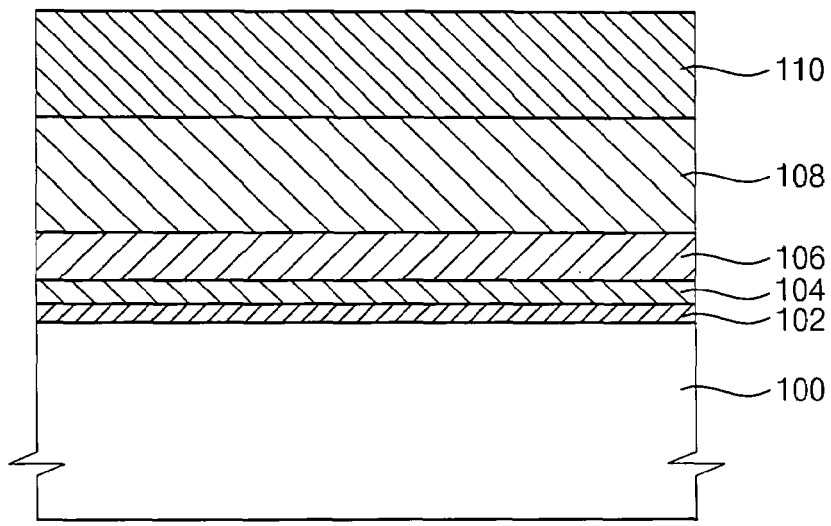
FIGS. 1 to 6 are cross-sectional views illustrating a nonvolatile memory device and a method of manufacturing the same according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIGS. 1 to 6 are cross-sectional views illustrating a non-volatile memory device and a method of manufacturing a non-volatile memory device according to some embodiments of the present invention.

Referring to FIG. 1, an isolation layer may be formed to define an active region in a surface portion of a integrated circuit substrate 100, such as a silicon wafer. For example, the isolation layer may be formed in the surface portion of the semiconductor substrate 100 by a local oxidation of silicon (LOCOS) or a shallow trench isolation (STI) process.

A tunnel insulating layer 102, a charge-trapping layer 104, a blocking layer 106, a gate conductive layer 108 and a hard mask layer 110 may be sequentially formed on the semiconductor substrate 100.

The tunnel insulating layer 102 may include silicon oxide ($SiO_2$), and may be formed to a thickness of about 20 Å to about 80 Å by a thermal oxidation process. For example, the tunnel insulating layer 102 may be formed to a thickness of about 35 Å on the semiconductor substrate 100.

In accordance with some embodiments of the present invention, a second tunnel insulating layer may be further formed on the tunnel insulating layer 102 to reduce a leakage current of the tunnel insulating layer 102 (in other words, the layer 102 may be a multi-layer structure). The second tunnel insulating layer may have a thickness less than of that of the tunnel insulating layer 102 and may include metal oxide and/or metal nitride. For example, the second tunnel insulating layer may be formed to a thickness of about 5 Å to about 15 Å by an atomic layer deposition (ALD) process, and may include aluminum oxide, aluminum nitride, zirconium oxide, tantalum oxide, titanium oxide and/or the like. Thus, these materials may be used alone or in a combination thereof.

The charge-trapping layer 104 may be formed to trap electrons from a channel region of the semiconductor substrate 100. For example, the charge-trapping layer 104 may be formed to a thickness of about 20 Å to about 100 Å on the tunnel insulating layer 102 and may include silicon nitride (SiN). For example, the charge-trapping layer 104 may be formed to a thickness of about 70 Å by a low pressure chemical vapor deposition (LPCVD) process.

In accordance with some embodiments of the present invention, the charge-trapping layer 104 may include nanocrystalline material. For example, the charge-trapping layer 104 may include nanocrystalline silicon, nanocrystalline silicon germanium, a nanocrystal line metal, nanocrystalline germanium and/or the like. Further, the charge-trapping layer 104 may include silicon-rich oxide.

In accordance with still other embodiments of the present invention, the charge-trapping layer 104 may include a high-k dielectric material having a dielectric constant k higher than that of silicon nitride. Examples of the high-k material may include metal oxide, metal oxynitride, metal silicon oxide, metal silicon oxynitride and/or the like. Thus, these materials can be used alone or in a combination thereof. Examples of metals that may be used for the high-k material may include hafnium (Hf), zirconium (Zr), aluminum (Al), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu) and/or the like. Thus, these metals can be used alone or in a combination thereof.

The blocking layer 106 may be formed to provide electrical insulation between the charge-trapping layer 104 and the gate conductive layer 108. The blocking layer 106 may include silicon oxide. When a silicon oxide layer is used as the blocking layer 106, the silicon oxide layer may have a thickness thicker than that of the tunnel insulating layer 102.

In accordance with some embodiments of the present invention, the blocking layer 106 may include a high-k material having a dielectric constant k higher than that of silicon nitride. For example, the blocking layer 106 may include metal oxide, metal oxynitride, metal silicon oxide, metal silicon oxynitride and/or the like. Thus, these materials can be used alone or in a combination thereof. Examples of a metal that may be used for the blocking layer 106 may include hafnium (Hf), zirconium (Zr), aluminum (Al), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu) and/or the like. Thus, these metals can be used alone or in a combination thereof.

Further, the blocking layer 106 may have a dielectric constant k higher than that of the tunnel insulating layer 102. For example, when the blocking layer 106 includes silicon oxide, the blocking layer 106 may include aluminum oxide and may be formed to a thickness of about 100 Å to about 400 Å on the charge-trapping layer 104. In some embodiments, the blocking layer 106 may be formed to a thickness of about 200 Å on the charge-trapping layer 104 by a chemical vapor deposition (CVD) process and/or an ALD process.

The gate conductive layer 108 may include polysilicon doped with impurities, metal, metal nitride, metal oxide, metal oxynitride, metal silicide and/or the like. For example, the gate conductive layer 108 may include titanium (Ti), titanium nitride (TiN), tantalum (Ta), tantalum nitride (TaN), tungsten (W), tungsten nitride (WN), hafnium (Hf), niobium (Nb), molybdenum (Mo), molybdenum nitride ($Mo_2N$), ruthenium monoxide (RuO), ruthenium dioxide ($RuO_2$), iridium (Ir), iridium oxide ($IrO_2$), platinum (Pt), cobalt (Co), chromium (Cr), titanium aluminide ($Ti_3Al$), titanium aluminum nitride ($Ti_2AlN$), palladium (Pd), tungsten silicide (WSi), nickel silicide (NiSi), cobalt silicide (CoSi), tantalum silicide (TaSi) and/or the like. Thus, these materials may be used alone or in a combination thereof.

For example, the gate conductive layer 108 may include a tantalum nitride layer and a tungsten layer. The tantalum nitride layer may be formed to a thickness of about 200 Å, and may serve as a metal barrier layer between the blocking layer 106 and the tungsten layer. The tungsten layer may be formed to a thickness of about 300 Å on the tantalum nitride layer.

In accordance with some embodiments of the present invention, a metal silicide layer, such as a tungsten silicide layer, a tantalum silicide layer, a cobalt silicide layer, a titanium silicide layer and/or the like, may be formed instead of the tungsten layer. Further, a tungsten nitride layer, which may serve as an adhesion layer between the tantalum nitride layer and the tungsten layer, may be formed to a thickness of about 50 Å.

The hard mask layer 110 may include silicon oxide and/or silicon nitride and may be formed to a thickness of about 200 Å to about 1,000 Å by a CVD process.

Figure 2:
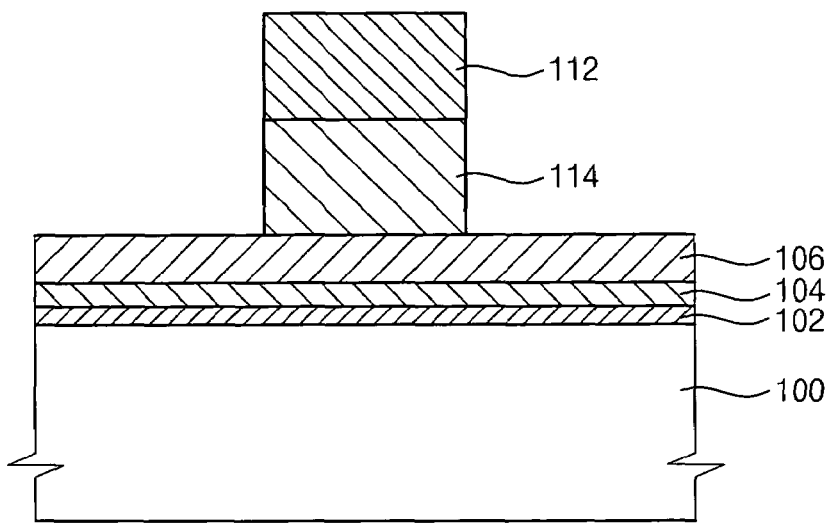

Referring to FIG. 2, a photoresist pattern may be formed on the hard mask layer 110 by a photolithography process. The hard mask layer 110 may be patterned to form a hard mask 112 by an anisotropic etching process using the photoresist pattern as an etching mask. The photoresist pattern may be removed by an ashing process and/or a stripping process after forming the hard mask 112.

The gate conductive layer 108 may be patterned to form a gate electrode 114 by an anisotropic etching process using the hard mask 112. Here, the blocking layer 106 may serve as an etch-stop layer and may be partially removed while forming the gate electrode 114.

As mentioned above, the gate electrode 114 may be formed by the etching process using the hard mask 112. However, in accordance with some embodiments of the present invention, the gate electrode 114 may be formed by an etching process using the photoresist pattern. As such, processes for forming the hard mask 112 may be omitted out.

Figure 3:
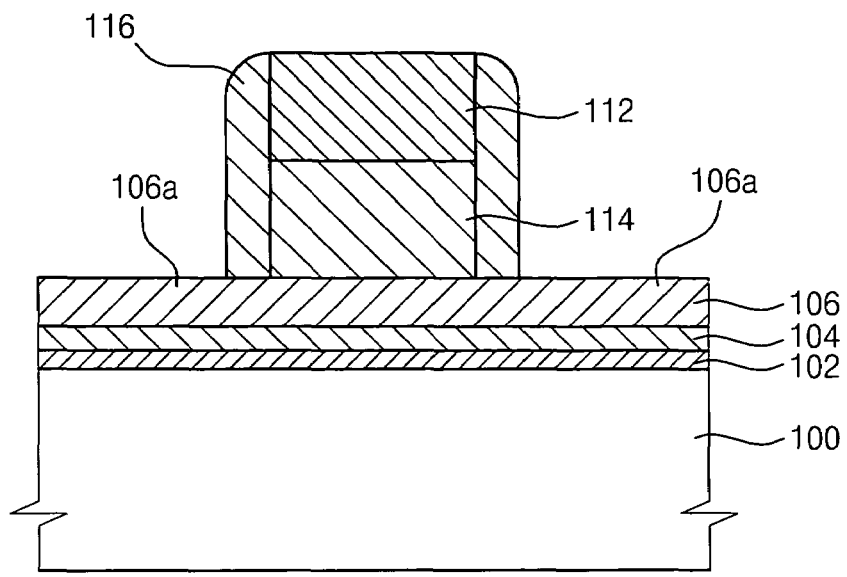

Referring to FIG. 3, spacers 116 may be formed on side walls (surfaces) of the gate electrode 114 and the hard mask 112 to complete a gate electrode structure. In accordance with some embodiments of the present invention, a spacer layer may be formed on the hard mask 112, the gate electrode 114 and exposed portions 106a of the blocking layer 106. The spacer layer may include silicon nitride and may be formed by an LPCVD process. The spacer layer may be partially removed by an anisotropic etching process to form nitride spacers 116 on the side surfaces of the gate electrode 114 and the hard mask 112.

In accordance with other embodiments of the present invention, the spacer layer may include silicon oxide, and oxide spacers may be formed on the side surfaces of the gate electrode 114 and the hard mask 112. Further, nitride spacers may be formed on the oxide spacers.

Figure 4:
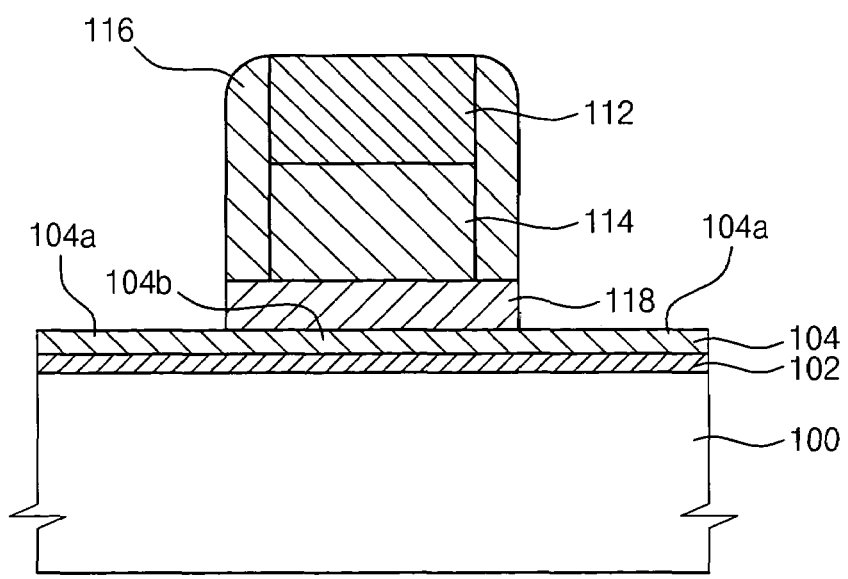

Referring to FIG. 4, the blocking layer 106 may be patterned to form a first blocking layer pattern 118 by an anisotropic etching process using the nitride spacers 116 and the hard mask 112 as etching masks. The anisotropic etching process for forming the first blocking layer pattern 118 may be performed to expose portions 104a of the charge-trapping layer 104. The charge-trapping layer 104 may serve as an etch-stop layer.

Meanwhile, electrons trapped in a portion 104b of the charge-trapping layer 104, which is arranged beneath the first blocking layer pattern 118, may be diffused toward the portions 104a of the charge-trapping layer 104. That is, as thermal or electrical stress is applied to the gate structure, the lateral diffusion of the trapped electrons may occur. As a result, the high-temperature stress (HTS) characteristics and data reliability of a non-volatile memory device may be deteriorated.

Thus, the exposed portions 104a of the charge-trapping layer 104 may be removed. However, when an anisotropic etching process is performed to remove the portions 104a of the charge-trapping layer 104, it is difficult to control the etching process. The difficulty may be a result of the thinness of the charge-trapping layer 104 and because an etching selectivity between the tunnel insulating layer 102 and the charge-trapping layer 104 may be small. Further, the tunnel insulating layer 102 may be damaged by the etching process for removing the exposed portions 104a, which may increase a leakage current of the tunnel insulating layer 102.

In accordance with some embodiments of the present invention, the lateral diffusion of electrons may be reduced or even prevented by removing trap sites in the exposed portions 104a of the charge-trapping layer 104. For example, the trap sites in the exposed portions 104a may be removed by an oxidation process.

Figure 5:
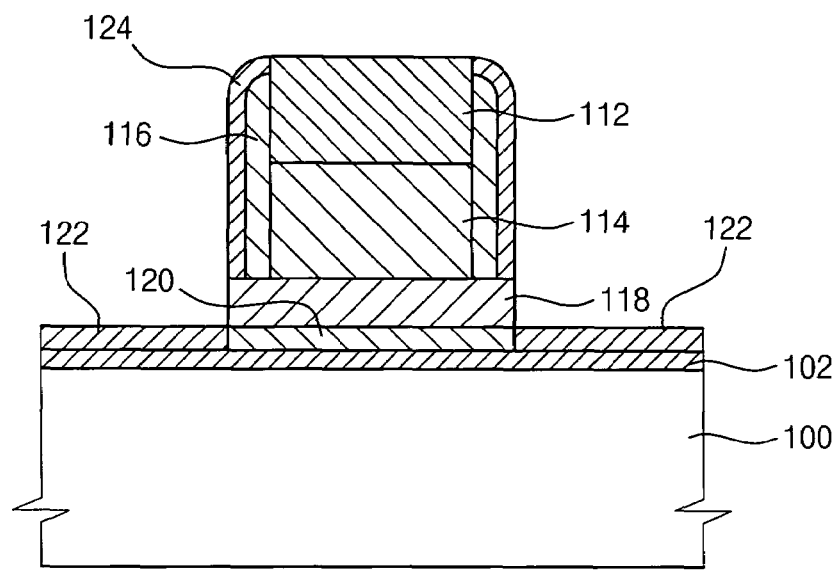

Referring to FIG. 5, an oxidation process and/or a heat treatment may be performed to form a charge-trapping layer pattern 120 and second blocking layer patterns 122. The second blocking layer patterns 122 may be formed to limit or even prevent the lateral diffusion of electrons.

The second blocking layer patterns 122 may be formed by oxidizing the exposed portions 104a of the charge-trapping layer 104. As a result, the charge-trapping layer pattern 120 may be arranged between the second blocking layer patterns 122.

For example, a radical oxidation process using oxygen radicals may be performed. The radical oxidation process may be performed at a temperature of about 800° C. to about 1,100° C. and under a pressure of about 1 mTorr to about 10 Torr. In some embodiments, the radical oxidation process may be performed at a temperature of about 800° C. to about 950° C., for example, at a temperature of about 900° C.

Further, the radical oxidation process may be performed using a reactive gas including oxygen ($O_2$) and hydrogen ($H_2$). The radical oxidation process may be performed using a batch-type or single-type oxidation apparatus including a plasma source. Examples of the plasma source may include a remote plasma generator using microwave energy, a modified-magnetron type (MMT) plasma generator using a radio frequency (RF) power source, etc. Meanwhile, a flow rate of the hydrogen gas may be about 10 percent to about 33 percent of a flow rate of the reactive gas.

In accordance with other embodiments of the present invention, a plasma oxidation process may be performed at a relatively low temperature, for example, a temperature of about 400° C., using a reactive gas including oxygen ($O_2$) and hydrogen ($H_2$).

In accordance with still other embodiments of the present invention, the heat treatment (or a thermal oxidation process) may be performed in a gas atmosphere including oxygen. For example, the heat treatment may be performed at a temperature of about 800° C. to about 1,100° C. using a reactive gas, such as oxygen ($O_2$), ozone ($O_3$), water vapor ($H_2O$), nitrogen monoxide (NO), nitrous oxide ($N_2O$), and/or the like. Thus, these gases may be used alone or in a combination thereof. Further, the reactive gas may further include an inert gas such as nitrogen ($N_2$), argon (Ar) and/or the like.

When the charge-trapping layer 104 includes silicon nitride, the second blocking layer patterns 122 may include silicon oxynitride. Further, although the charge-trapping layer 104 includes a high-k material or a nanocrystalline material, the trap sites in the exposed portions 104a of the charge-trapping layer 104 may be sufficiently removed by the oxidation process and/or the heat treatment.

Meanwhile, surface portions of the nitride spacers 116 may be oxidized while performing the oxidation process or the heat treatment to form the second blocking layer patterns 122. Thus, oxynitride spacers 124 may be formed on the nitride spacers 116.

In accordance with other embodiments of the present invention, a nitride layer pattern may be formed between the gate electrode 114 and the hard mask 112 to limit or even prevent surface portions of the gate electrode 114 from being oxidized by the oxidation process. That is, referring to FIGS. 1 and 2, when a silicon oxide layer is used as the hard mask layer 110, a silicon nitride layer (not shown) may be further formed on the gate conductive layer 108, and the nitride layer pattern may be formed by an anisotropic etching process using the hard mask 112 as an etching mask.

Figure 6:
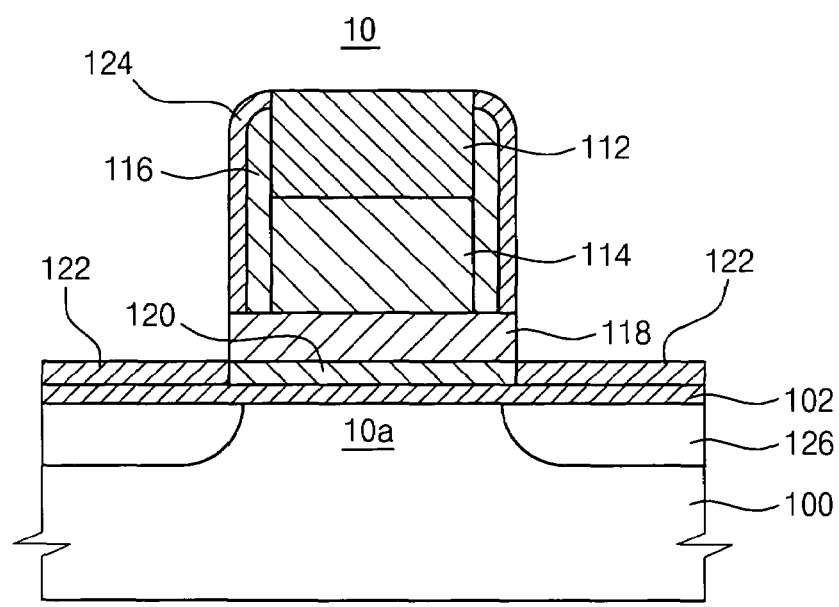

Referring to FIG. 6, after performing the oxidation process and/or the heat treatment, impurity regions 126 may be formed at surface portions of the semiconductor substrate 100. The impurity regions 126 may serve as source/drain regions. Here, a channel region 10a of a non-volatile memory device 10 may be defined between the impurity regions 126. The impurity regions 126 may be formed by an ion implantation process and a heat treatment. The heat treatment may be performed to activate impurities (dopants) implanted by the ion implantation process.

Though not shown in the figures, before or after performing the ion implantation process for forming the impurity regions 126, the second blocking layer patterns 122 may be partially removed by a wet etching process. The wet etching process may be controlled by a processing time. In some embodiments, the tunnel insulating layer 102 is not exposed by the wet etching process, which may prevent the tunnel insulating layer 102 from being damaged. In such a case, the oxidation process for forming the second blocking layer patterns 122 may be performed to partially oxidize the exposed portions 104a of the charge-trapping layer 104. For example, when a silicon nitride layer is used as the charge-trapping layer 104, the oxidation process on exposed portions of the silicon nitride layer may be performed such that a thickness of remaining portions of the silicon nitride layer after the oxidation process becomes less than about 10 Å. That is, the second blocking layer patterns 122 formed by the oxidation process may be arranged on the remaining portions of the silicon nitride layer. Further, an insulating interlayer (not shown) may be formed on remaining portions of the second blocking layer patterns 122 after the wet etching process. As a result, the lateral diffusion of electrons trapped in the charge-trapping layer pattern 120 may be reduced or even prevented by the insulating interlayer.

In accordance with some embodiments of the present invention as described above, a first blocking layer pattern may be disposed on a charge-trapping layer pattern of a non-volatile memory device, and second blocking layer patterns may be disposed on both sides of the charge-trapping layer pattern. Thus, lateral diffusion of electrons trapped in the charge-trapping layer pattern may be reduced or even prevented, and the HTS characteristics and reliability of the non-volatile memory device may be improved.

In some embodiments of a method of manufacturing a non-volatile memory device, a tunnel insulating layer, a charge-trapping layer and a blocking layer may be sequentially formed on a channel region of a substrate, and a gate electrode may be disposed on the blocking layer. The blocking layer may be patterned to form a first blocking layer pattern between the charge-trapping layer and the gate electrode and to expose portions of the charge-trapping layer. The exposed portions of the charge-trapping layer may be processed to form a charge-trapping layer pattern to trap electrons from the channel region and second blocking layer patterns to prevent lateral diffusion of the electrons trapped in the charge-trapping layer pattern.

As the second blocking layer patterns may be formed by an oxidation process, damage to a tunnel insulating layer may be limited or even prevented. Thus, a leakage current of the tunnel insulating layer may be reduced.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a non-volatile memory device comprising:
    forming a tunnel insulating layer on a channel region of a substrate;
    forming a charge-trapping layer on the tunnel insulating layer;
    forming a blocking layer on the charge-trapping layer;
    forming a gate electrode on the blocking layer;
    patterning the blocking layer to form a first blocking layer pattern between the charge-trapping layer and the gate electrode and to expose portions of the charge-trapping layer to form a charge-trapping layer pattern under the first blocking layer pattern between the exposed portions of the charge-trapping layer that extend laterally therefrom; and
    oxidizing the exposed portions of the charge-trapping layer to form second blocking layer patterns proximate sidewalls of the charge-trapping layer pattern to limit lateral diffusion of electrons trapped in the charge-trapping layer pattern.

2. The method of claim 1, wherein forming the gate electrode comprises:
    forming a gate conductive layer on the blocking layer;
    forming a hard mask on the gate conductive layer; and
    etching the gate conductive layer using the hard mask as an etching mask to form the gate electrode.

3. The method of claim 2, further comprising forming a nitride layer on the gate conductive layer to limit oxidation of the gate electrode.

4. The method of claim 1, further comprising:
    forming spacers on side walls of the gate electrode, wherein the charge-trapping layer is patterned using the spacers as etching masks.

5. The method of claim 1, wherein oxidizing the exposed portions of the charge-trapping layer comprises oxidizing the exposed portions of the charge-trapping layer using oxygen radicals.

6. The method of claim 1, wherein oxidizing the exposed portions of the charge-trapping layer comprises oxidizing the exposed portions of the charge-trapping layer using a reactive gas comprising oxygen ($O_2$) and hydrogen ($H_2$).

7. The method of claim 1, wherein oxidizing the exposed portions of the charge-trapping layer comprises oxidizing the exposed portions of the charge-trapping layer at a temperature of about 800° C. to about 1,100° C.

8. The method of claim 1, wherein oxidizing the exposed portions of the charge-trapping layer comprises oxidizing the exposed portions of the charge-trapping layer under a gas atmosphere comprising oxygen ($O_2$), ozone ($O_3$), water vapor ($H_2O$), nitrogen monoxide (NO) and/or nitrous oxide ($N_2O$).

* * * * *